(12) United States Patent
Cao et al.

(10) Patent No.: US 8,679,923 B2
(45) Date of Patent: Mar. 25, 2014

(54) METHOD FOR FORMING METAL GATE

(71) Applicants: Junzhu Cao, Shanghai (CN); Lily Jiang, Shanghai (CN); Cindy Li, Shanghai (CN); Creek Zhu, Shanghai (CN)

(72) Inventors: Junzhu Cao, Shanghai (CN); Lily Jiang, Shanghai (CN); Cindy Li, Shanghai (CN); Creek Zhu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/686,483

(22) Filed: Nov. 27, 2012

(65) Prior Publication Data

US 2013/0157449 A1    Jun. 20, 2013

(30) Foreign Application Priority Data

Dec. 15, 2011    (CN) .......................... 2011 1 0422106

(51) Int. Cl.
*H01L 21/8234*    (2006.01)

(52) U.S. Cl.
USPC .................... 438/275; 438/587; 257/E21.444

(58) Field of Classification Search
CPC ..... H01L 21/30; H01L 21/8232; H01L 29/49; H01L 29/66484; H01L 29/696606
USPC .......................... 257/E21.4, E21.44, E21.453
See application file for complete search history.

(56) References Cited

U.S. PATENT DOCUMENTS

| | | | |
|---|---|---|---|
| 6,171,910 B1 | 1/2001 | Hobbs et al. | |
| 2001/0027005 A1* | 10/2001 | Moriwaki et al. | 438/592 |
| 2010/0124818 A1* | 5/2010 | Lee et al. | 438/589 |

* cited by examiner

*Primary Examiner* — Cheung Lee
(74) *Attorney, Agent, or Firm* — Anova Law Group, PLLC

(57) ABSTRACT

A method for forming metal gates is provided. In the method, a substrate with a first region and a second region is provided. Dummy gate structures and an ILD layer is formed on the substrate. Dummy gates of the dummy gate structures are removed to form openings respectively within the two regions. Work function layers are respectively formed to overlay the openings. A metal layer is formed on the work function layers and then a CMP process is performed until the ILD layer is exposed, thereby forming the metal gates within the two regions at the same time. Only one CMP process is performed to the metal layer, so that over polishing of the ILD layer may be reduced and thickness of metal gates may be more accurately controlled.

16 Claims, 10 Drawing Sheets

METHOD FOR FORMING METAL GATE

CROSS REFERENCE TO RELATED APPLICATIONS

The present application claims priority to Chinese Patent Application No. CN201110422106.7, entitled "METHOD FOR FORMING METAL GATE", and filed on Dec. 15, 2011, the entire disclosure of which is incorporated herein by reference.

FIELD OF THE DISCLOSURE

The present disclosure generally relates to the field of semiconductor manufacturing and, more particularly, to a method for forming metal gates.

BACKGROUND OF THE DISCLOSURE

With continuous development of semiconductor technology, sizes of semiconductor devices are scaling down, so are the sizes of semiconductor devices' components. Taking a MOS transistor as an example, the MOS transistor's overall structure shrinks and, accordingly, dimensions of the source, the drain and the gate structures also decrease, resulting in a thinner gate dielectric layer. However, if the gate electric layer is not thick enough, the breakdown voltage may be unacceptably small, and the leakage current between the gate and the channel region (namely, the gate leakage) may increase, which may cause device failure. Therefore, a gate stack including a high-k dielectric layer and a metal gate is introduced into the MOS transistor to reduce the gate leakage and improve the electrical performance. Normally, to avoid the metal material of the metal gate from undesirably affecting other components, the gate stack is formed in a "gate-last" process.

With current techniques, it is quite often that PMOS transistors and NMOS transistors are formed in a same substrate. However, the metal gates of the PMOS transistors and the NMOS transistors are different. More specifically, the work function layers of the metal gates have different parameters and structures. Therefore, in the gate-last process, the metal gates of the POMS and NMOS transistors are often formed separately.

Further, in a conventional process of CMOS transistor formation, at least two CMP processes are employed to form the metal gates, in which over polishing may occur twice. It's often difficult to anticipate the quantity of the transistors which may be undesirably over polished.

Therefore, there is a need to provide a method for forming metal gates, in which less over polishing occurs, so as to accurately control the metal gates' thickness.

SUMMARY

One embodiment of the present disclosure provides a method for forming metal gates. A substrate with a first region and a second region is provided. A first dummy gate structure and a second dummy gate structure are formed respectively within the first region and the second region. The dummy gate structures include dummy gates. An interlayer dielectric layer is formed on the substrate, which has a top surface leveling with top surfaces of the first dummy gate structure and the second dummy gate structure. The dummy gate of the first dummy gate structure is removed to form a first opening. A first work function layer is formed within the first region, overlaying the first opening's sidewalls and bottom surface and the interlayer dielectric layer. The dummy gate of the second dummy gate structure is removed to form a second opening. A second work function layer is formed within the second region, overlaying the second opening's sidewalls and bottom surface and the interlayer dielectric layer. A metal layer is formed on the first work function layer and the second work function layer. A CMP process is performed to the metal layer, the first work function layer and the second work function layer until the interlayer dielectric layer is exposed to form a first metal gate and a second metal gate. In the method, only one CMP process may be performed to the metal layer and, therefore, less quantity of the interlayer dielectric layer may be over polished, which is desired for accurately controlling the metal gates' thickness.

DETAILED DESCRIPTION OF THE DISCLOSURE

FIGS. 1 to 5 are cross-sectional views of intermediate structures in a conventional process for forming metal gates for a CMOS transistor.

Figure 1:
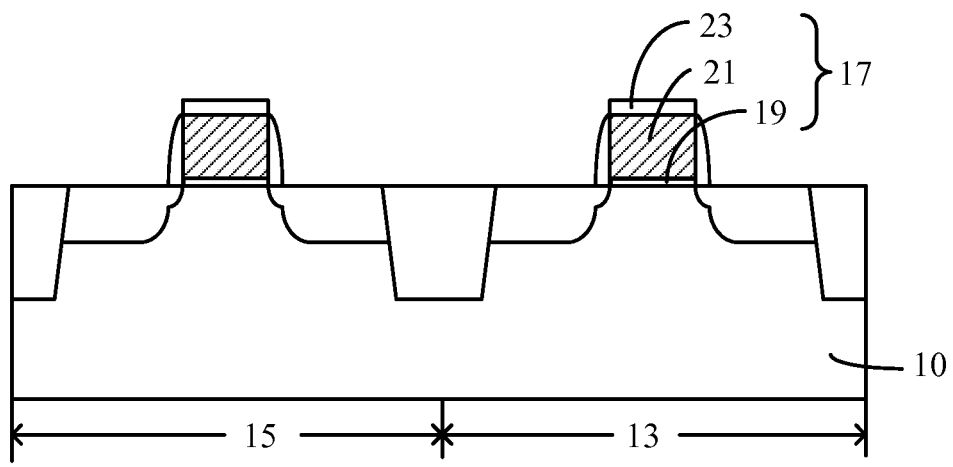
FIGS. 1 to 5 are cross-sectional views of intermediate structures in a conventional process for forming metal gates for a CMOS transistor.
Figure 2:
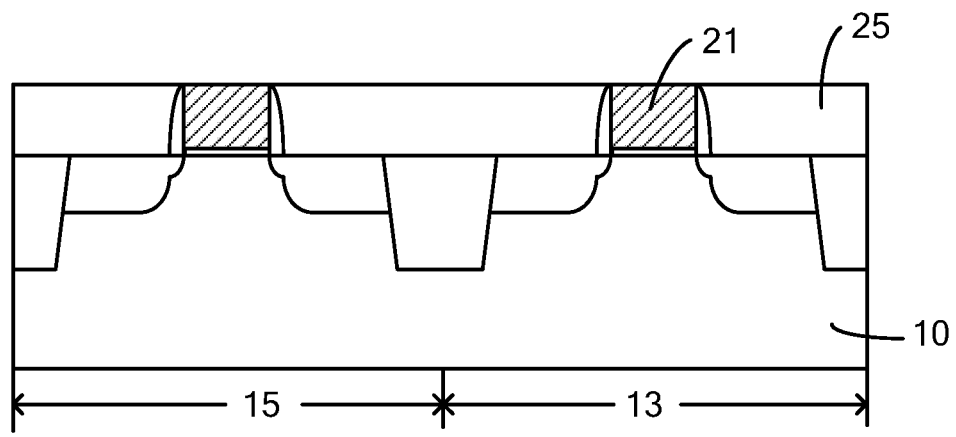

Referring to FIG. 1, a substrate 10 including a PMOS region 13 and a neighboring NMOS region 15 is provided. Dummy gate structures 17 are respectively formed on the PMOS region 13 and the NMOS region 14. Each dummy gate structure 17 includes a dummy gate dielectric layer 19 on the substrate 10 and a dummy gate 21 on the dummy gate dielectric layer 19. A source region and a drain region (not labeled in FIG. 1) are formed in the substrate 10 on opposite sides of each dummy gate structure.

Thereafter, an original interlayer dielectric (ILD) layer is formed to cover the substrate 10 and the dummy gate structures 17. The original ILD layer is planarized to form an ILD layer 25 (referring to FIG. 2) which levels with the dummy gates' top surfaces.

Figure 3:
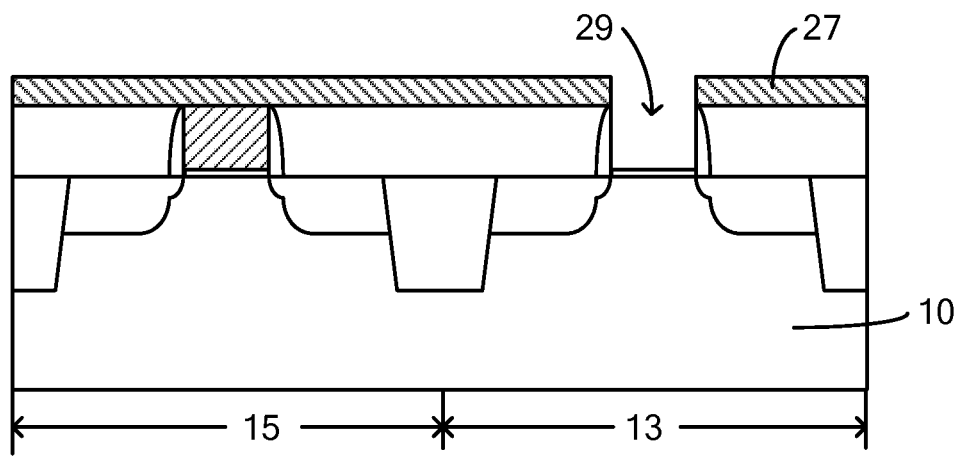

Referring to FIG. 3, a patterned photoresist layer 27 is formed on the ILD layer 25 and the dummy gate on the NMOS region, exposing the dummy gate on the PMOS region. With the patterned photoresist layer 27, the dummy gate on the PMOS region is etched to form a gate opening 29.

Figure 4:
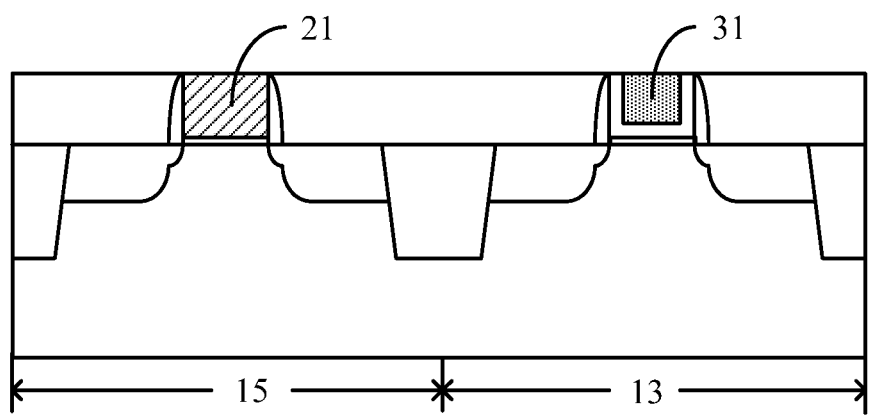

Referring to FIG. 4, high-k gate dielectric material and metal gate material are filled into the gate opening 29 and then subjected to a first chemical mechanical polishing (CMP) process. The first CMP process is performed until the dummy gate on the NMOS region 15 is exposed. The high-k dielectric material and metal gate material which are remained in the gate opening 29 (shown in FIG. 3) constitute a metal gate 31 of the PMOS transistor.

Figure 5:
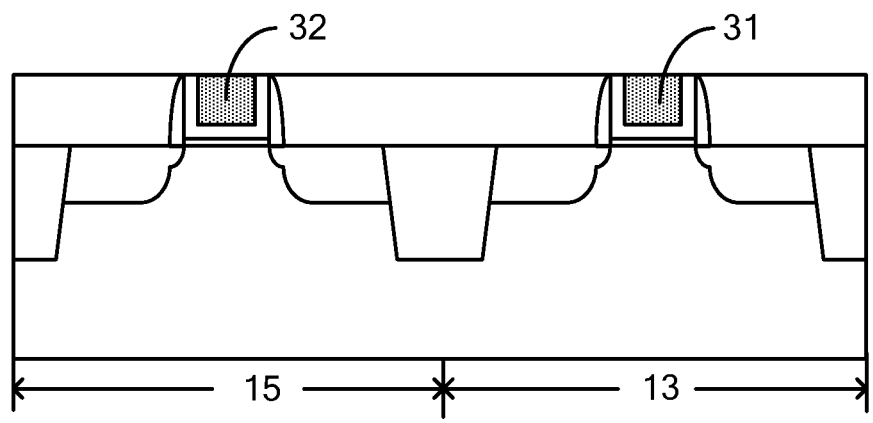

Referring to FIG. 5, a metal gate 32 of the NMOS transistor is formed by performing similar process steps described above in which a second CMP process is included.

When polishing the high-k dielectric and metal gate materials, due to over polishing, the ILD layer is partially removed in each CMP process described above. It may be more difficult to control the thickness of the ILD layer when two CMP processes have to be performed.

Figure 6:
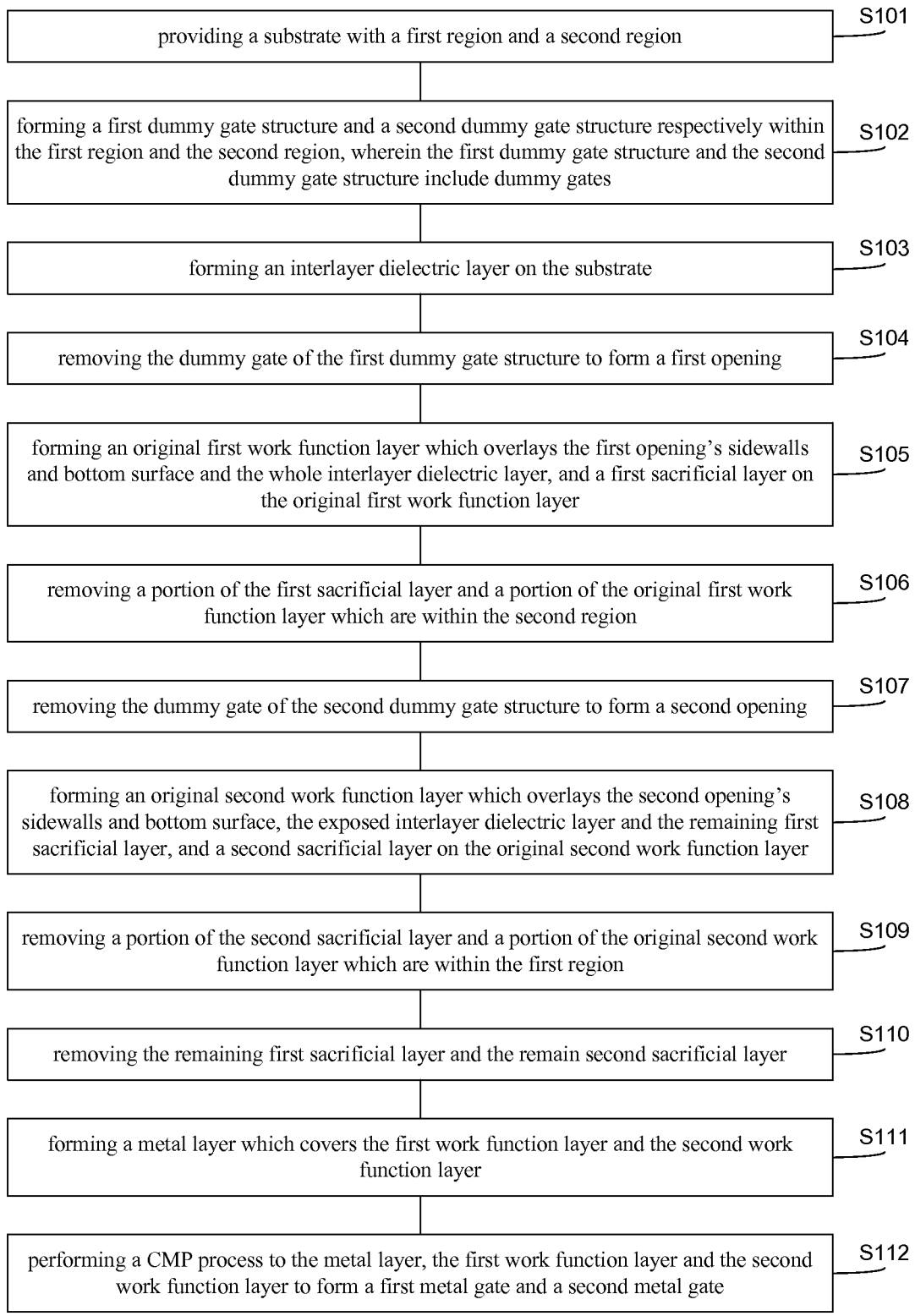
FIG. 6 is a flow chart of a method for forming metal gates according to an embodiment of the present disclosure.

FIG. 6 shows an exemplary method for forming metal gates according to a disclosed embodiment. Referring to FIG. 6, steps S101 to S109 are included in the method. Process steps for forming metal gates will be illustrated in conjunction with other drawings with cross-sectional views of the corresponding semiconductor structure.

FIGS. 7 to 18 are cross-sectional views of intermediate structures illustrating the process for forming metal gates according to a disclosed embodiment.

Figure 7:
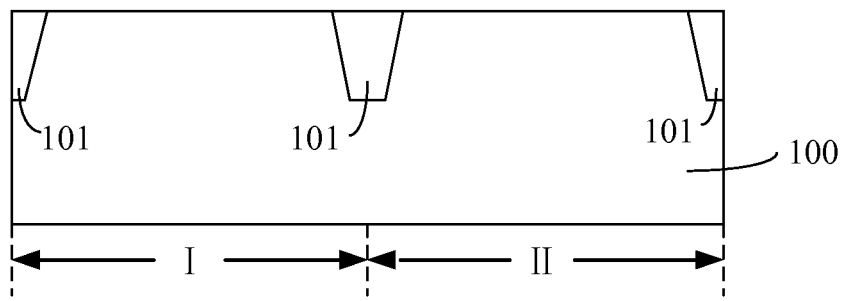
FIGS. 7 to 18 are cross-sectional views of intermediate structures illustrating the process for forming metal gates according to an embodiment of the present disclosure.

Referring to FIGS. 6 and 7, in step S101, a substrate 100 with a first region I and a second region II is provided.

The substrate 100 may be a silicon substrate, a germanium substrate, a silicon nitride substrate or a silicon-on-insulator substrate. It is understood that those skilled in the art may vary the types of the substrate according to the semiconductor devices formed thereon, so the substrate types may not limit the scope of the present disclosure.

The first region I and the second region II are respectively adapted for forming a PMOS transistor and an NMOS transistor therein. In following description, it will be illustrated as a non-limiting example that the first region I is adapted for forming a PMOS transistor and the second region II is adapted for forming an NMOS transistor. Preferably, shallow trench isolation (STI) structures 101 are formed in the substrate 100 to isolate the PMOS and NMOS transistors. In other embodiments, there are one or more devices formed between the PMOS and NMOS transistors.

Figure 8:
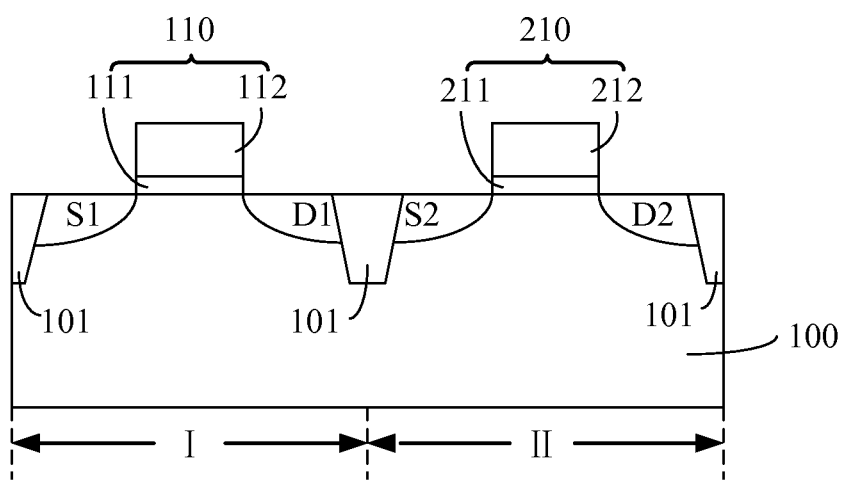

Referring to FIGS. 6 and 8, in step S102, a first dummy gate structure 110 and a second dummy gate structure 210 are formed respectively on the first region I and the second region II. The dummy gate structures 110 and 210 may be formed by using any appropriate fabrication processes.

In an exemplary embodiment, the first dummy gate structure 110 includes a first high-k dielectric layer 111 and a dummy gate 112 on the first high-k dielectric layer 111; the second dummy gate structure 210 includes a second high-k dielectric layer 211 and a dummy gate 212 on the second high-k dielectric layer 211. The dummy gates are removed in subsequent steps, so that metal gates including work function layers and metal electrodes can be formed on the high-k dielectric layers. The first high-k dielectric layer 111 and the second high-k dielectric layer 211 include hafnium oxide, zirconium oxide, magnesium oxide, hafnium nitride, or the like. Additionally or optionally, a silicon oxide layer may be formed between the substrate 100 and each of the high-k dielectric layers to reduce defects which may be caused by the lattice mismatch between the high-k material and the substrate. The dummy gates may be made of polysilicon and/or other appropriate semiconductor materials.

In certain embodiments, the dummy gate structures may only include the polysilicon layers, and the high-k dielectric layers may be formed after the removal of the polysilicon layers. In this way, the high-k dielectric layers may be unaffected by the removal process.

Optionally, spacers (not shown) may be formed on opposite sidewalls of the dummy gate structures, acting as masks in ion implantation processes for forming source and drain regions in the substrate 100. A source region S1 and a drain region D1 are formed on the first dummy gate structure 110's opposite sides. A source region S2 and a drain region D2 are formed on the second dummy gate structure 120's opposite sides. SiGe layers may be formed in S1 and D1 in an in-situ process to provide compressive stress which is beneficial for increasing mobility of holes in the PMOS transistor's channel, and SiC layers may be formed in S2 and D2 to provide tensile stress which is beneficial for increasing mobility of electrons in the NMOS transistor's channel, so as to improve the transistors' electric performance.

Further, to improve the electrical performance of the device, an N-well (not shown) may be formed in the first region I for the PMOS transistor and a P-well (not shown) may be formed in the second region II for the NMOS transistor.

Figure 9:
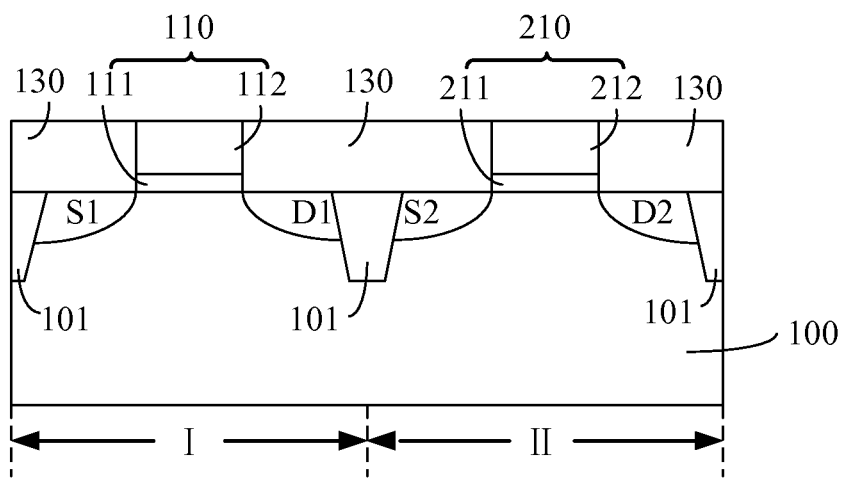

Referring to FIGS. 6 and 9, in step S103, an interlayer dielectric (ILD) layer 130 is formed over the substrate 100. The ILD layer 130's top surface levels with the top surfaces of the dummy gate structures.

In an exemplary embodiment, ILD material is deposited to cover the substrate 100 and the dummy gate structures by CVD. Then the ILD layer 130 is planarized until the dummy gate structures are exposed. Optionally, before depositing the ILD material, a barrier layer (not shown) may be formed to overlay the substrate 100 and the dummy gate structures. The ILD material is polished by CMP until the exposure of the barrier layer, and then the barrier layer together with the ILD material is polished until the dummy gate structures are exposed. That is, the barrier layer may be used as a polishing stop layer for subsequent polishing process on the first dummy gate structure 110 and the second dummy gate structure 210 to control the height of later-formed metal gates. Therefore, over polishing of the dummy gate structures may be reduced, which is beneficial for controlling the final thickness of the metal gates.

Figure 10:
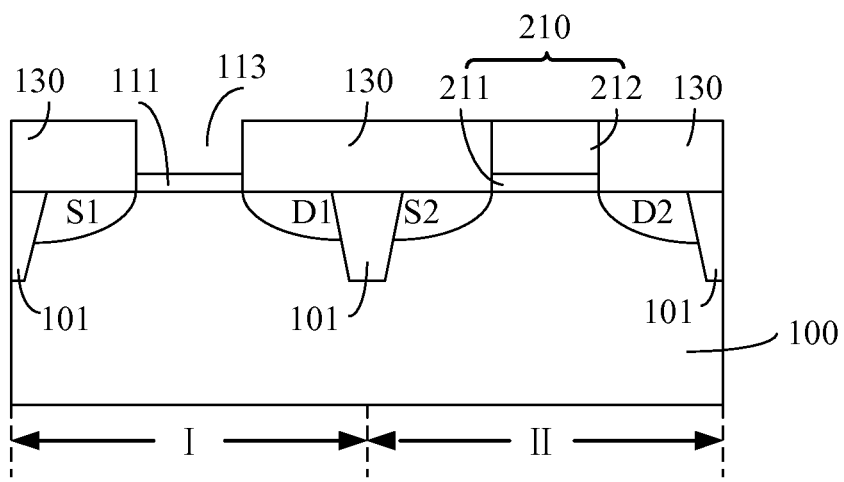

Referring to FIGS. 6 and 10, in step S104, the polysilicon layer of the first dummy gate structure is removed to form a first opening 113.

The polysilicon layers in the dummy gate structures need to be removed to form openings, so that metal gates can be formed in the openings. However, the PMOS and NMOS transistors are designed to have different work functions, so that the work function layers thereof are different in at least one aspect selected from material, thickness and formation process. As a result, the work functions layers need to be formed separately for the PMOS and NMOS transistors.

A mask layer (not shown) which at least covers the second dummy gate structure 210 and exposes the first dummy gate structure 110 is formed on the ILD layer 130. Thereafter, a wet etching process is performed to remove the polysilicon layer of the first dummy gate structure 110, so as to form the first opening 113. As described above, the dummy gate structure may include a polysilicon layer and a high-k dielectric layer, and the first high-k dielectric layer 111 remains in the first opening 113 after the polysilicon layer is removed. Thereafter, the mask layer is removed.

The mask layer may be a photoresist layer or a hard mask layer which may include TiN, SiN or the like. And the wet etching process may use KOH solution as etchant to remove the polysilicon in the first dummy gate structure 110.

Figure 11:
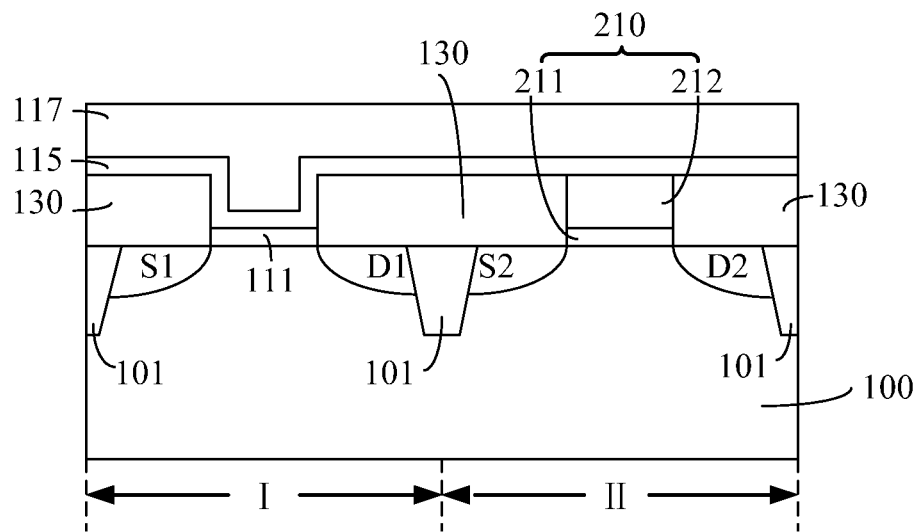

Referring to FIGS. 6 and 11, in step S105, a first original work function layer 115 is formed to overlay the first opening 113's sidewalls and bottom surface and the ILD layer 130's top surface; and a first sacrificial layer 117 is formed on the first original work function layer 115.

The first original work function layer 115 includes any one or more material selected from Ti, Ta, TiN, TaN, TiAl, TaC, TaSiN and TiAlN. The first original work function layer 115 may be formed by a PVD or atomic layer deposition (ALD) process. In certain embodiments, a PMOS transistor is to be formed in the first region I, and the first original work function layer 115 includes TiN and is formed by an ALD process.

Further, before forming the first original work function layer 115, a first diffusion barrier layer (not shown) may be further formed to overlay the first opening 113's sidewalls and bottom surface and the ILD layer 130's top surface. The first diffusion barrier layer is adapted for preventing the subsequently formed metal gate from diffusing into the ILD layer and the high-k dielectric layers, which may cause short circuit between components and interconnection layers. The first diffusion barrier layer may include TiN or TaN. In certain embodiments, formation of diffusion barrier layers is omitted to simplify the process, because work function layers are capable of preventing the diffusion of metal. That is, the function layer may act as a diffusion barrier layer such that the fabrication process can be simplified.

As described above, the dummy gate structures may include only polysilicon layers, without the high-k dielectric layers (i.e., the high-k dielectric layers are not formed before forming the polysilicon layers). As a result, before forming the first original work function layer or the first diffusion barrier layer, a high-k dielectric layer can be formed. In this case, the high-k dielectric layer may overlay the first opening's sidewalls and bottom surface and the ILD layer 130's top surface, and then the first original work function layer or the first diffusion barrier layer is formed to overlay the high-k dielectric layer's top surface.

The first sacrificial layer 117 may be formed on the first original work function layer 115. The first sacrificial layer 117 may include silicon oxide, spin-on glass composition or polymer. The sacrificial layer is removed in subsequent process steps. In one embodiment, the first sacrificial layer 117 includes a spin-on glass composition, for example, polysilazane, which is easy to be removed in wet etching, which can improve efficiency of the process and reduce process time and cost.

Figure 12:
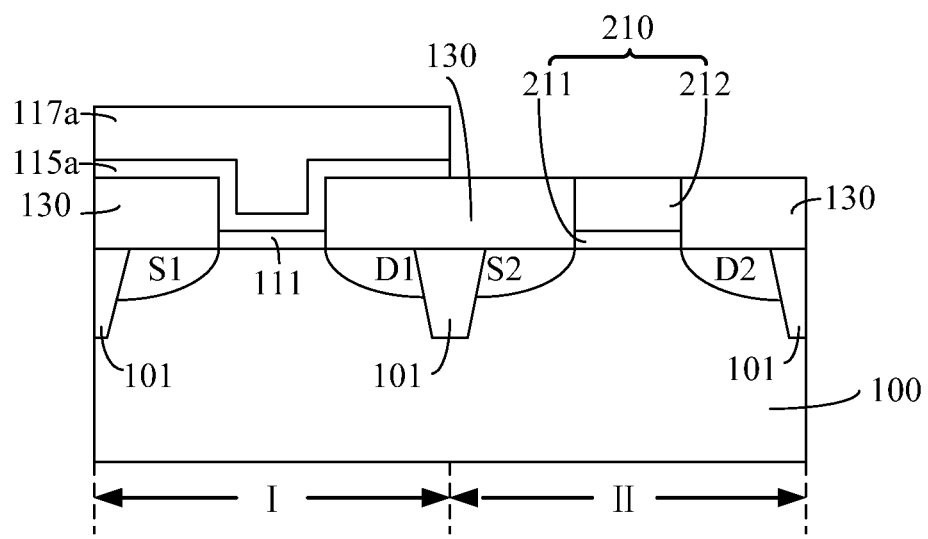

Referring to FIGS. 6 and 12, in step S106, a portion of the first sacrificial layer 117 (shown in FIG. 11) and a portion of the first original work function layer 115 (shown in FIG. 11) which are within the second region II are removed, so that the second dummy gate structure 120 is exposed. The remaining first work function layer 115a and the remaining sacrificial layer 117a are formed within the first region I.

The second dummy gate structure 120 is exposed, so that the second polysilicon layer 212 can be removed in a subsequent step. The portions of the first original work function layer and the sacrificial layer may be removed by any appropriate process. For example, a photoresist layer may be formed to cover the first region I and, thereafter, wet etching or dry etching processes are performed until the second dummy gate structure 120 and the ILD layer 130 in the second region II are exposed. The first sacrificial layer and the first original work function layer may be etched in the same dry etching process or may be respectively etched in a dry etching process and a wet etching process. After the second dummy gate structure 120 is exposed, the photoresist layer is removed by, for example, an ashing process.

Figure 13:
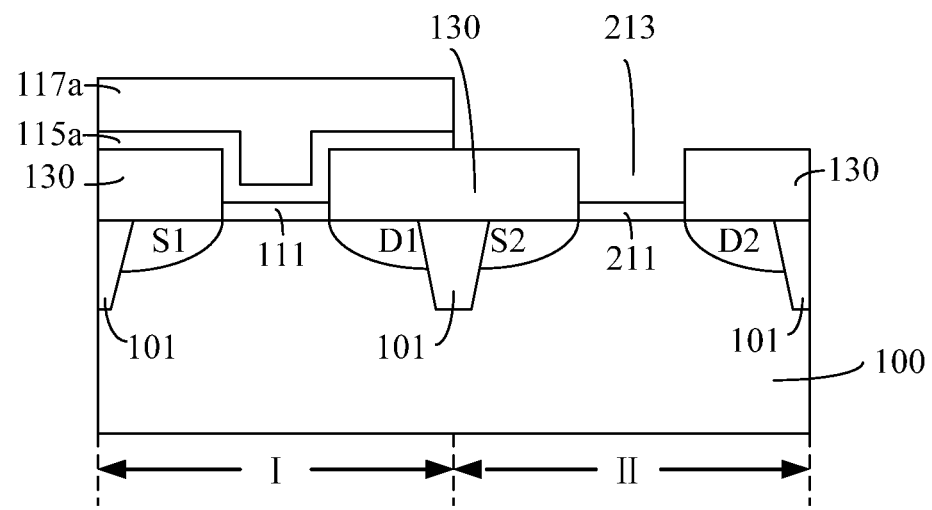

Referring to FIGS. 6 and 13, in step S107, the polysilicon layer of the second dummy gate structure is removed to form a second opening 213, similar to step S104.

Figure 14:
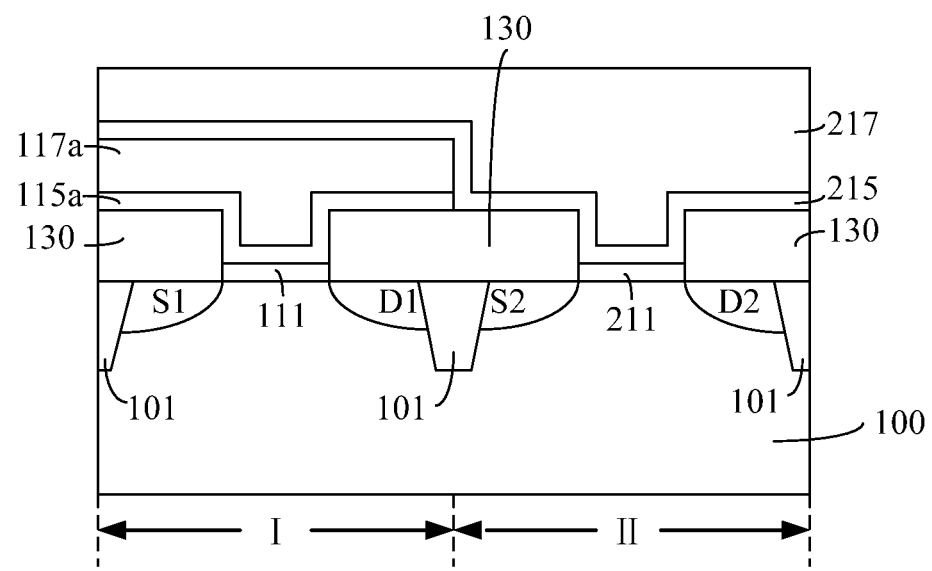

Referring to FIGS. 6 and 14, in step S108, a second original work function layer 215 is formed to overlay the second opening's sidewalls and bottom surface, the exposed interlayer dielectric layer 130 and the remaining first sacrificial layer 117a; and a second sacrificial layer 217 is formed on the second original work function layer 215.

The second original work function layer 215 and the second sacrificial layer 217 may be formed similarly to above descriptions in step S105. The second original work function layer 215 includes one or more material selected from Ti, Ta, TiN, TaN, TiAl, TaC, TaSiN and TiAlN. The second original work function layer 215 may be formed by a PVD process or an atomic layer deposition (ALD) process. It should be noted that, as an NMOS transistor is to be formed in the second region II in the embodiment, the second original work function layer 215 includes TiAl and is formed by an ALD process. Because the work function layers of the PMOS and NMOS transistors are formed separately, it may be convenient for manufacturers to adjust the material, thickness and formation process according to the different gate work functions of the transistors, so that suitable processes and materials may be adopted.

Figure 15:
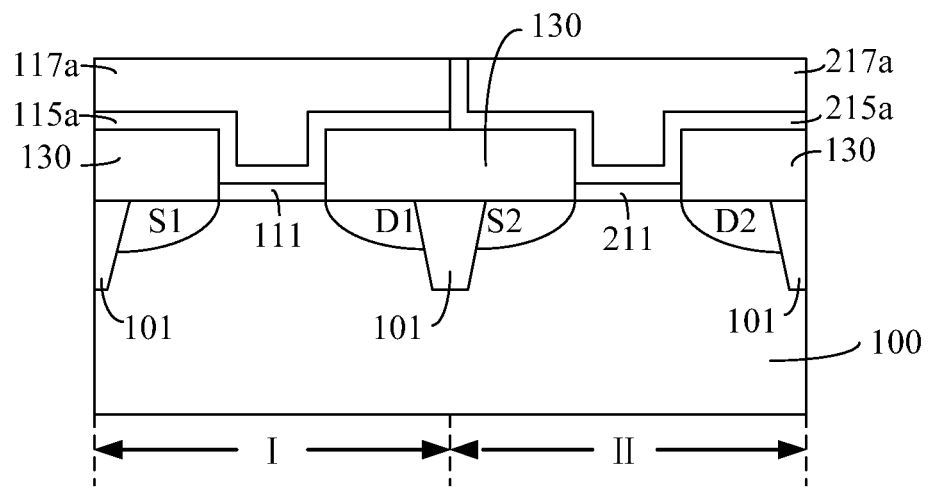

Referring to FIGS. 6 and 15, in step S109, a portion of the second sacrificial layer 217 (shown in FIG. 14) and a portion of the second original work function layer 215 (shown in FIG. 14) within the first region I are removed. Therefore, the remaining second sacrificial layer 217a and the remaining second working function layer 215a are formed within the second region II, and the remaining first sacrificial layer 117a is exposed.

The portions of the second sacrificial layer and the second original work function layer within the first region I may be removed by similarly to above descriptions in step S106. In one embodiment, a CMP process is performed until the remaining first sacrificial layer 117a is exposed, so that the portions of the second sacrificial layer and the second original work function layer within the first region I may be removed. Furthermore, as a result of the CMP process, the remaining first sacrificial layer 117a and the remaining second sacrificial layer 217a may have top surfaces leveling with each other, which is desired for the subsequent etching process.

Figure 16:
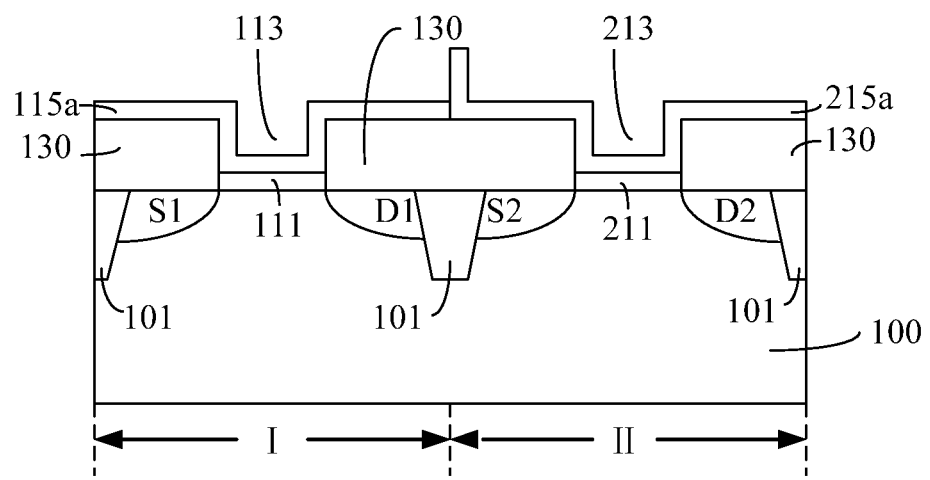

Referring to FIGS. 6 and 16, in step S110, the remaining first sacrificial layer 117a (shown in FIG. 15) and the remaining second sacrificial layer 217a (shown in FIG. 15) are removed. The remaining first work function layer 115a and the remaining second work function layer 215a are exposed. Also, the first opening 113 and the second opening 213 are exposed.

Dry etching and wet etching may be used to remove the sacrificial layers. For example, the remaining sacrificial layers may be removed by a wet etching process. As described above, the sacrificial layers may include a spin-on glass composition, so that diluted hydrofluoric acid may be used as an etchant in the wet etching process. In another example, the remaining sacrificial layers may be removed by a dry etching process by using the remaining work function layers as etch stop layers.

By performing above described process steps, work function layers suitable for a PMOS transistor and an NMOS transistor are formed respectively within the first region I and the second region II. Further, the remaining sacrificial layer within region I and the remaining sacrificial layer within region II may be removed in the same process, such that damages and/or complex processes may be avoided.

Figure 17:
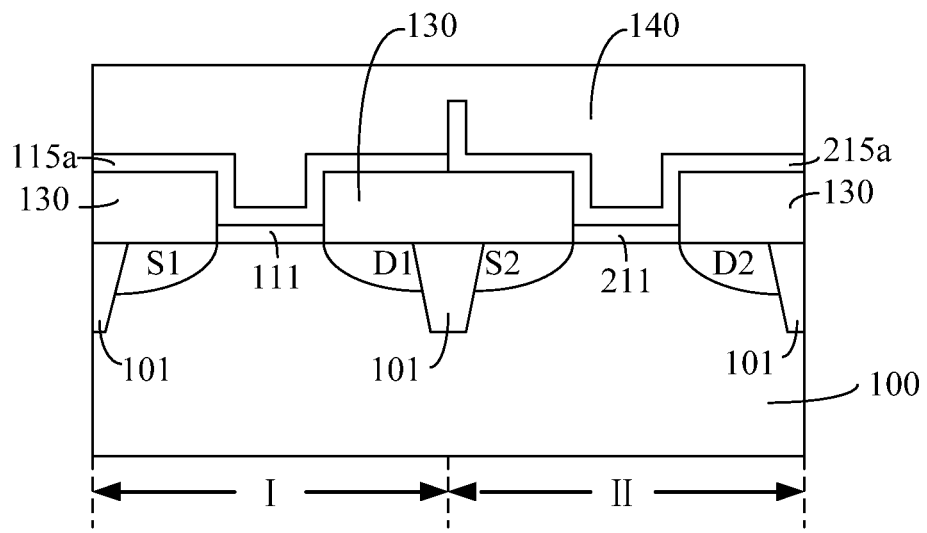

Referring to FIGS. 6 and 17, in step S111, a metal layer 140 is formed on the remaining first work function layer 115a and the second work function layer 215a.

Metal electrodes of PMOS and NMOS transistors may include the same material. The metal layer 140 fills up the first and second openings (referring to FIG. 16). The metal layer 140 includes one or more material selected from Al, Cu, Ti, Ag, Au, Pt and Ni. The metal layer 140 may be formed by sputtering, CVD or electroplating.

Figure 18:
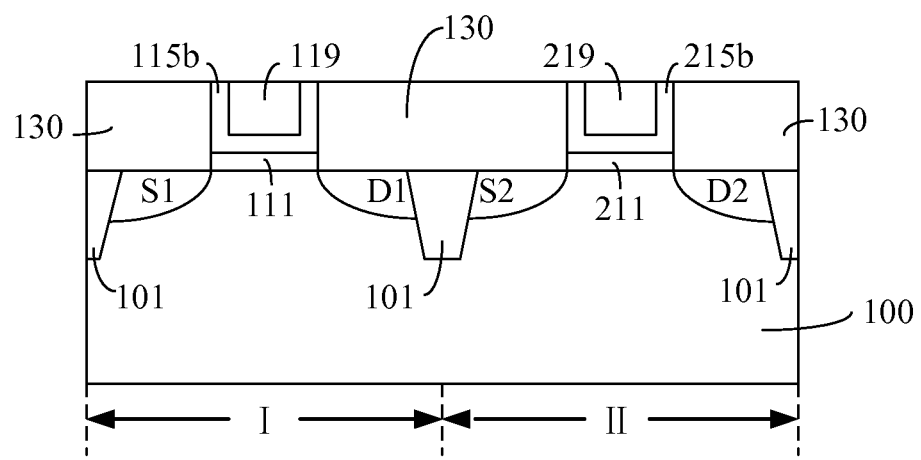

Referring to FIGS. 6 and 18, in step S112, a CMP process may be performed to remove portion the metal layer, portion of the first work function layer 115a, and portion of the second work function layer 215a to form a first metal gate and a second metal gate.

The CMP process is performed until the ILD layer 130 is exposed. The first metal gate includes the first work function layer 115b and a first metal electrode 119 on the first work function layer 115b. The second metal gate includes the second work function layer 215b and a second metal electrode 219 on the second work function layer 215b. That is, the first metal gate and the second metal gate may be formed in the same CMP process.

Therefore, by using the disclosed method for forming metal gates, only one CMP process may be performed to the metal layer, which means over polishing (if any) only happens once for the ILD layer. Therefore, less quantity of the ILD may be over polished, which is desired for accurately controlling the metal gates' thickness.

Based on the disclosure, those skilled in the art can make any variation and modification without departing from the scope of the disclosure. Therefore, any obvious modification, variation and polishing based on the embodiments described herein is within the scope of the present disclosure.

What is claimed is:

1. A method for forming metal gates, comprising:
   providing a substrate with a first region and a second region;
   forming a first dummy gate structure and a second dummy gate structure within the first region and the second region, respectively, wherein the first dummy gate structure includes a first dummy gate and the second dummy gate structure includes a second dummy gate;
   forming an interlayer dielectric layer on the substrate exposing the first dummy gate structure and the second dummy gate structure;
   removing the first dummy gate of the first dummy gate structure to form a first opening;
   forming a first work function layer within the first region over the interlayer dielectric layer and the first opening, and within the second region over the second dummy gate;
   forming a first sacrificial layer on the first work function layer;
   exposing the second region by removing a portion of the first sacrificial layer and a portion of the first work function layer from the second region to leave a remaining first sacrificial layer and a remaining of the first work function layer in the first region on top of the interlayer dielectric layer;
   removing the second dummy gate of the second dummy gate structure to form a second opening;
   forming a second work function layer within the second region overlaying the second opening, over the interlayer dielectric layer in the second region, and over the remaining first sacrificial layer in the first region comprising the first opening;
   forming a second sacrificial layer on the second work function layer;
   removing a portion of the second sacrificial layer and a portion of the second work function layer from the first region to expose the remaining first sacrificial layer in the first region on top of the interlayer dielectric layer and to leave a remaining second sacrificial layer on a remaining second working function layer in the second region on top of the interlayer dielectric layer;
   exposing the first opening comprising a portion of the remaining first work function layer and exposing the second opening comprising a portion of the remaining second work function layer by removing the remaining first sacrificial layer and the remaining second sacrificial layer;
   forming a metal layer on the first work function layer and the second work function layer; and
   performing a CMP process to the metal layer, the first work function layer and the second work function layer to form a first metal gate and a second metal gate.

2. The method according to claim 1, wherein:
   a top surface of the interlayer dielectric layer levels with top surfaces of the first dummy gate structure and the second dummy gate structure;
   the first work function layer overlays the first opening's sidewalls and bottom surface and the interlayer dielectric layer; and
   the second work function layer overlays the second opening's sidewalls and bottom surface and the interlayer dielectric layer.

3. The method according to claim 1, wherein forming the first work function layer within the first region comprises:
   forming a first work function layer overlaying the first opening's sidewalls and bottom surface.

4. The method according to claim 3, further comprising: forming a first diffusion barrier layer overlaying the first opening's sidewalls and bottom surface and the interlayer dielectric layer's top surface before forming the first work function layer.

5. The method according to claim 1, wherein removing the portion of the second sacrificial layer and the portion of the second work function layer within the first region comprises: performing a CMP process to the second sacrificial layer and the second work function layer until the remaining first sacrificial layer is exposed.

6. The method according to claim 1, wherein the remaining first sacrificial layer and the remaining second sacrificial layer are removed by wet etching or dry etching.

7. The method according to claim 6, wherein the first and second sacrificial layers comprise spin-on glass composition, and the remaining first and second sacrificial layers are removed by a wet etching process by using diluted hydrofluoric acid as an etchant.

8. The method according to claim 1, wherein the CMP process is performed by taking the interlayer dielectric layer as a stop layer.

9. The method according to claim 1, wherein the first work function layer and the second work function layer are different in at least one aspect selected from material, thickness and formation process.

10. The method according to claim 1, wherein both the first work function layer and the second work function layer include at least one material selected from Ti, Ta, TiN, TaN, TiAl, TaC, TaSiN and TiAlN.

11. The method according to claim 1, wherein both the first work function layer and the second work function layer are formed by a PVD process or an ALD process.

12. The method according to claim 1, wherein the first and second sacrificial layers comprise silicon oxide, spin-on glass composition or polymer.

13. The method according to claim 12, wherein the spin-on glass composition is polysilazane.

14. The method according to claim 1, wherein the metal layer comprises at least one material selected from Al, Cu, Ti, Ag, Au, Pt and Ni.

15. The method according to claim 1, wherein the metal layer is formed by sputtering, CVD or electroplating.

16. The method according to claim 1, further comprising: forming a second diffusion barrier layer overlaying the second opening's sidewalls and bottom surface, the exposed interlayer dielectric layer and the remaining first sacrificial layer before forming the second work function layer.

\* \* \* \* \*